US008867260B2

(12) United States Patent
Huang et al.

(10) Patent No.: US 8,867,260 B2
(45) Date of Patent: Oct. 21, 2014

(54) READING CIRCUIT FOR A RESISTIVE MEMORY CELL

(71) Applicant: Agency for Science, Technology and Research, Singapore (SG)

(72) Inventors: Kejie Huang, Singapore (SG); Ning Ning, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 0 days.

(21) Appl. No.: 13/869,146

(22) Filed: Apr. 24, 2013

(65) Prior Publication Data

US 2013/0279237 A1    Oct. 24, 2013

Related U.S. Application Data

(60) Provisional application No. 61/637,345, filed on Apr. 24, 2012.

(51) Int. Cl.
G11C 11/00 (2006.01)
G11C 13/00 (2006.01)

(52) U.S. Cl.
CPC .......... *G11C 13/004* (2013.01); *G11C 13/0002* (2013.01)
USPC .......................................... 365/148; 365/163

(58) Field of Classification Search
USPC ..................................... 365/148, 163, 189.07
See application file for complete search history.

(56) References Cited

U.S. PATENT DOCUMENTS 5,552,728 A   9/1996 Lin
8,107,273 B1* 1/2012 Hollmer et al. ............... 365/148

OTHER PUBLICATIONS

Kobayahsi et al., "A Current-Controlled Latch Sense Amplifier and a Static Power-Saving Input Buffer for Low-Power Architecture," IEEE Journal of Solid-State Circuits, vol. 28, No. 4, pp. 523-527, 1993.
Maxim, "Low-Cost, Micropower, High-Side Current-Sense Amplifier + Comparator + Reference ICs," 19-1630, Rev 2, Oct. 2003.
Masuda et al., "High Current Efficiency Sense Amplifier Using Body-Bias Control for Ultra-Low-Voltage SRAM," IEEE, 2011.
Lecture 24, available at http://inst.eecs.berkeley.edu/~ee42/sp04/lectures/lecture2.pdf, accessed Jan. 5, 2012.

* cited by examiner

*Primary Examiner* — Huan Hoang
(74) *Attorney, Agent, or Firm* — Winstead, P.C.

(57) ABSTRACT

A reading circuit for a resistive memory cell is provided, the circuit including a current source, a precharge switch, a comparator circuit including a first input node (in-node), and a second in-node, the precharge switch configured to couple the current source to the first in-node to apply a precharge voltage during a first reading time period, and to decouple the current source during a second reading time period, the comparator circuit configured to operate during a third reading time period, a memory cell access switch to enable a current flow at least partially during the second and the third reading time periods through a memory cell, the comparator circuit configured to compare a voltage at the first in-node with a reference voltage at the second in-node and to determine a programming state of the memory cell based on the voltage at the first in-node during the third reading time period.

18 Claims, 7 Drawing Sheets

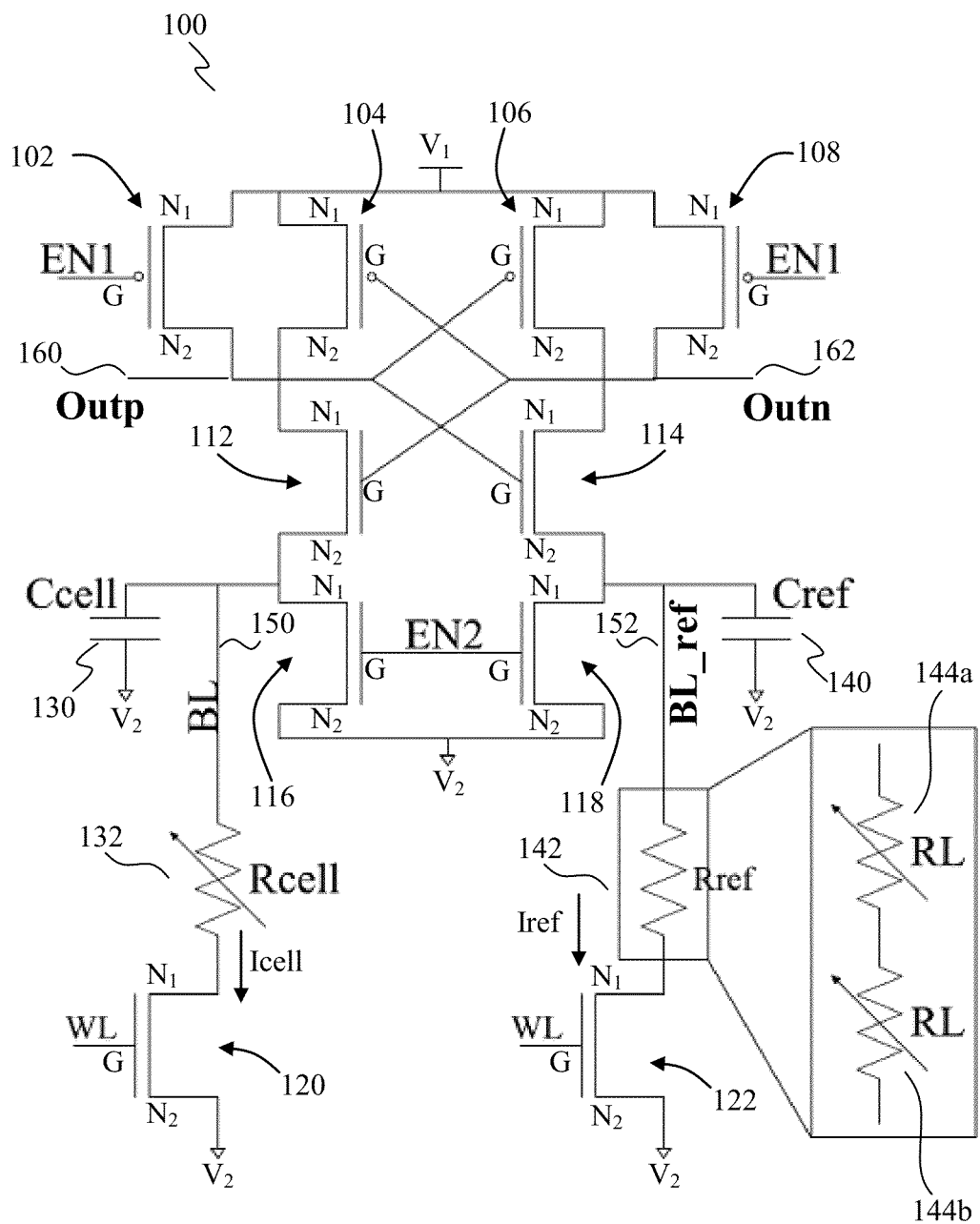
FIG. 1 (Conventional)

READING CIRCUIT FOR A RESISTIVE MEMORY CELL

CROSS-REFERENCE TO RELATED APPLICATION

This application claims the benefit of priority of U.S. provisional application No. 61/637,345, filed 24 Apr. 2012, the content of it being hereby incorporated by reference in its entirety for all purposes.

TECHNICAL FIELD

Various embodiments relate to a reading circuit for a resistive memory cell.

BACKGROUND

Resistive random-access memory (RRAM) is an emerging non-volatile memory (NVM) whose basic idea is that a dielectric, which is normally insulating, can be made to conduct through a filament or conduction path formed after the application of a sufficiently high voltage. The conduction path formation can arise from different mechanisms, including defects, metal migration, etc. Once the filament is formed, it may be reset (broken, resulting in high resistance) or set (re-formed, resulting in lower resistance) by an appropriately applied voltage.

As compared to other NVMs such as phase-change random-access memory (PCRAM) and magnetoresistive random-access memory (MRAM), RRAM has the advantages of faster write time, smaller write power, and larger resistance ratio. However, RRAM cells are subjected to within-die resistance variations and reading-voltage-dependent disturbance, demanding a careful control of the reading voltage.

In NVM reading circuits, a current sensing scheme is generally used in phase-change RAM and MRAM, as shown in FIG. 1, to achieve a faster read speed than a voltage sensing scheme. A similar current sensing scheme may also be used for RRAM.

FIG. 1 shows a schematic view of a conventional current sensing amplifier 100 for resistive random-access memory (RRAM). The current sensing amplifier 100 includes a first p-channel metal oxide semiconductor (PMOS) transistor 102, a second PMOS transistor 104, a third PMOS transistor 106, a fourth PMOS transistor 108, a first n-channel metal oxide semiconductor (NMOS) transistor 112, a second NMOS transistor 114, a third NMOS transistor 116, a fourth NMOS transistor 118, a fifth NMOS transistor 120 and a sixth NMOS transistor 122. Each of the first PMOS transistor 102, second PMOS transistor 104, third PMOS transistor 106, fourth PMOS transistor 108, first NMOS transistor 112, second NMOS transistor 114, third NMOS transistor 116, fourth NMOS transistor 118, fifth NMOS transistor 120 and sixth NMOS transistor 122 respectively has a first node ($N_1$), a second node ($N_2$) and a gate node (G).

The respective first nodes ($N_1$) of each of the first PMOS transistor 102, second PMOS transistor 104, third PMOS transistor 106 and fourth PMOS transistor 108 are coupled together, and coupled to a first voltage point, $V_1$. The second node ($N_2$) of the first PMOS transistor 102 are coupled to the second node ($N_2$) of the second PMOS transistor 104, the gate node (G) of the third PMOS transistor 106 and the gate node (G) of the second NMOS transistor 114, while the second node ($N_2$) of the fourth PMOS transistor 108 are coupled to the second node ($N_2$) of the third PMOS transistor 106, the gate node (G) of the second PMOS transistor 104 and the gate node (G) of the first NMOS transistor 112. The second node ($N_2$) of the first PMOS transistor 102 may be coupled to a first output node (outp) 160, while the second node ($N_2$) of the fourth PMOS transistor 108 may be coupled to a second output node (outn) 162. The respective gate nodes (G) of each of the first PMOS transistor 102 and the fourth PMOS transistor 108 may receive a first enable signal (EN1). This may mean that the first enable signal (EN1) may be employed to control the operation of the respective gate nodes and hence the respective operations of the first PMOS transistor 102 and the fourth PMOS transistor 108.

The second node ($N_2$) of the second PMOS transistor 104 and the first node ($N_1$) of the first NMOS transistor 112 are coupled together, while the second node ($N_2$) of the third PMOS transistor 106 and the first node ($N_1$) of the second NMOS transistor 114 are coupled together. Accordingly, the respective second nodes ($N_2$) of the first PMOS transistor 102 and the second PMOS transistor 104, and the first node ($N_1$) of the first NMOS transistor 112 are coupled to the gate node (G) of the third PMOS transistor 106 and the gate node (G) of the second NMOS transistor 114, while the respective second nodes ($N_2$) of the third PMOS transistor 106 and the fourth PMOS transistor 108, and the first node ($N_1$) of the second NMOS transistor 114 are coupled to the gate node (G) of the second PMOS transistor 104 and the gate node (G) of the first NMOS transistor 112.

The second node ($N_2$) of the first NMOS transistor 112 and the first node ($N_1$) of the third NMOS transistor 116 are coupled together, and are further coupled to a cell capacitor 130 with a parasitic capacitance, $C_{cell}$, and a memory cell 132 with a resistance, $R_{cell}$, via a bit line (BL) 150. The memory cell 132 may have a variable resistance $R_{cell}$.

The second node ($N_2$) of the second NMOS transistor 114 and the first node ($N_1$) of the fourth NMOS transistor 118 are coupled together, and are further coupled to a reference capacitor 140 with a parasitic capacitance, $C_{ref}$, and a reference cell 142 with a resistance, $R_{ref}$, via a reference bit line ($BL_{ref}$ or BL_ref) 152.

The respective second nodes ($N_2$) of the third NMOS transistor 116 and the fourth NMOS transistor 118 are coupled together and coupled to a second voltage point, $V_2$. The respective gate nodes (G) of the third NMOS transistor 116 and the fourth NMOS transistor 118 are coupled together, and which may receive a second enable signal (EN2). This may mean that the second enable signal (EN2) may be employed to control the operation of the respective gate nodes and hence the respective operations of the third NMOS transistor 116 and the fourth NMOS transistor 118.

The cell parasitic capacitor 130 is further coupled to the second voltage point, $V_2$. The memory cell 132 is further coupled to the first node ($N_1$) of the fifth NMOS transistor 120, where the second node ($N_2$) of the fifth NMOS transistor 120 is coupled to the second voltage point, $V_2$, while the gate node (G) of the fifth NMOS transistor 120 is coupled to a word line (WL).

The reference parasitic capacitor 140 is further coupled to the second voltage point, $V_2$. The reference cell 142 is further coupled to the first node ($N_1$) of the sixth NMOS transistor 122, where the second node ($N_2$) of the sixth NMOS transistor 122 is coupled to the second voltage point, $V_2$, while the gate node (G) of the sixth NMOS transistor 122 is coupled to the word line (WL). The reference cell 142 may include two resistors 144a, 144b, coupled in series. Each of the resistors 144a, 144b, may have a low resistance, $R_L$, which may be variable.

The first voltage point, $V_1$, may be a power supply line (e.g. VDD), and the second voltage point, $V_2$, may be at a potential lower than $V_1$, for example, grounded.

Initially, both EN1 and EN2 are "low" to charge both nodes BL 150 and BL_ref 152 to $V_1$. When the respective potentials on BL 150 and BL_ref 152 are equalized, EN1 is raised to "high" to turn off the precharge PMOS (e.g. first PMOS transistor 102 and fourth PMOS transistor 108), and the nodes BL 150 and BL_ref 152 begin to discharge. The different resistances of $R_{cell}$ and $R_{ref}$ may result in different discharge speeds corresponding to the nodes BL 150 and BL_ref 152. As a result, the output nodes, outp 160 and outn 162 at the low resistance side may be pulled to $V_2$ while at the high resistance side may be pulled up to $V_1$. Then, the third NMOS transistor 116 and the fourth NMOS transistor 118 may be turned on by raising EN2 to "high" to latch the data.

In the conventional current sensing scheme, as employed by the current sensing amplifier 100, one or more reference cells may be used to generate a reference current, $I_{ref}$, for comparison with the read cell current, $I_{cell}$, flowing through the memory cell 132. Since a low resistance ($R_L$) may determine the maximum current $I_{ref}$ required, the two resistors 144a, 144b, coupled in series and having the total resistance $2R_L$ may be considered as the reference cell. However, this type of current sensing scheme is not suitable in the case when the reading current, $I_{cell}$, of the memory cell 132 (e.g. RRAM) is very small (even in the case where $I_{RL}$, being the reading current corresponding to the low resistance, $R_L$, of the memory cell 132, is only ~200 nA), and thus very sensitive to noise. Therefore, it has to wait until BL 150 or BL_ref 152 has been discharged to lower than ($V_{thp}+V_{thn}$), where $V_{thp}$ and $V_{thn}$ are the respective threshold voltages of a PMOS transistor and an NMOS transistor, before raising EN1 to "high". Otherwise, the current passing through the NMOS transistor pair of the third NMOS transistor 116 and the fourth NMOS transistor 118, controlled by the EN2 signal, as shown in FIG. 1, may be much larger than the current passing through the memory cell 132 (e.g. RRAM cell), resulting in incorrect readings due to the unbalanced loadings of $C_{cell}$ and $C_{ref}$. Therefore, the sensing speed may be slow. Moreover, the sensing speed may be determined by ($R_{ref} \times C_{ref}$), which usually is in the range from ($2 \times R_L \times C_{cell}$) to ($0.5 \times R_H \times C_{cell}$).

In view of the unfavorable factors associated with the conventional current sensing amplifier 100, there is thus a need for a current sensing scheme capable of handling weak RRAM reading current and slow accumulation speed.

SUMMARY

According to an embodiment, a reading circuit for a resistive memory cell is provided. The reading circuit may include a current source, a precharge switch coupled to the current source, a comparator circuit including a first input node, a second input node, an output node and an enable node, wherein the precharge switch is configured to couple the current source to the first input node of the comparator circuit such that the current provided by the current source is provided to the first input node to apply a precharge voltage at the first input node during a first reading time period, and to decouple the current source from the first input node during a second reading time period, wherein the comparator circuit is configured to operate during a third reading time period upon application of an enable signal at the enable node of the comparator circuit, at least one memory cell access switch to enable a current flow through a memory cell or to disable a current flow through a memory cell, wherein the at least one memory cell access switch is configured to allow a current flow at least partially during the second and the third reading time periods through the memory cell, wherein the comparator circuit is further configured to compare a voltage applied to the first input node with a reference voltage applied to the second input node and to determine a programming state of the memory cell based on the voltage present at the first input node during the third reading time period.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 1 shows a schematic view of a conventional current sensing amplifier for resistive random-access memory (RRAM).

DETAILED DESCRIPTION

Figure 2:
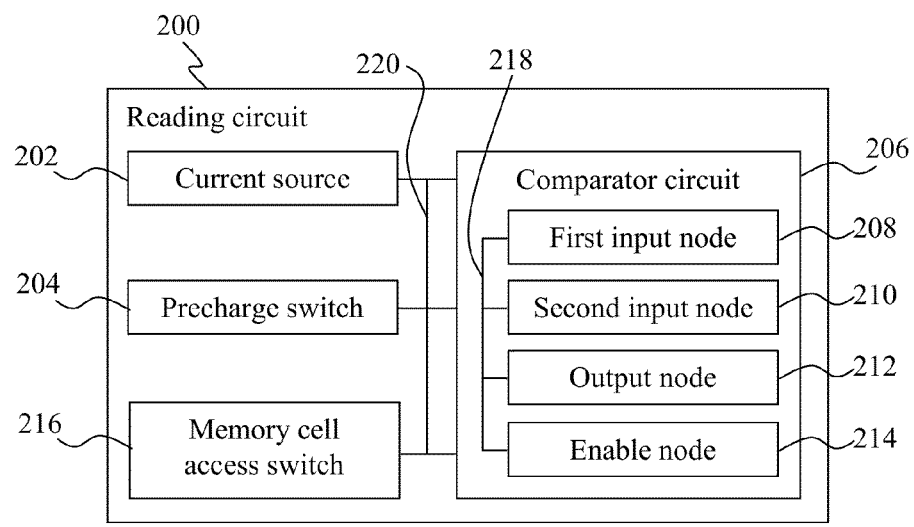
FIG. 2 shows a schematic block diagram of a reading circuit for a resistive memory cell, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other method or device. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element includes a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

Various embodiments relate to memory devices, for example, the various embodiments of the technology may be related to reading circuits of memory devices.

Various embodiments may provide a resistive random-access memory (RRAM) low resistance side sensing reading circuit. The reading circuit may employ a low resistance side sensing scheme to read out small current signals.

The reading circuit of various embodiments may be free of high resistance ($R_H$) distribution effect, and may be with minimized low resistance ($R_L$) distribution effect by using different sensing times. The reading circuit of various embodiments may provide accurate and fast reading time, with low power consumption. The reading circuit of various embodiments may include a latch, which may be a fully dynamic latched comparator in order to save or reduce the power consumption.

Various embodiments may provide a RRAM reading circuit including a sense latch circuit that may be configured to turn off after sensing, a high (resistance) side sensing in which a precharge $V_{read}$ (read voltage) may be provided to a bit line (BL) node, such that when the memory cell (RRAM cell) is in a high (resistance) state, the BL node may be maintained at $V_{read}$, and when the memory cell (RRAM cell) is in a low (resistance) state (e.g. resistance=$R_L$), the BL node may be discharged to ($I_{read} \times R_L$), where $I_{read}$ is the read current through the memory cell (RRAM cell), and $R_L$ is the resistance of the memory cell (RRAM cell) in a low resistance state. Therefore, the bit line (BL) node may be at different voltages, depending on the resistance state of the memory cell (RRAM cell). In various embodiments, $I_{read}$ may be at least substantially fixed or constant.

Various embodiments may provide accurate results and fast reading speeds of approximately 50 ns. Various embodiments not only may solve the small reading current problem in RRAM, they may also be applicable for low power applications.

FIG. 2 shows a schematic block diagram of a reading circuit 200 for a resistive memory cell, according to various embodiments. Examples of like or equivalent features that may be present in the reading circuit 300 (FIG. 3), as will be described later, corresponding to the respective features of the reading circuit 200 are denoted in square brackets [ . . . ].

The reading circuit 200 includes a current source 202, a precharge switch 204 coupled to the current source 202, a comparator circuit 206 including a first input node 208, a second input node 210, an output node 212 and an enable node 214, wherein the precharge switch 204 is configured to couple the current source 202 to the first input node 208 of the comparator circuit 206 such that the current provided by the current source 202 is provided to the first input node 208 to apply a precharge voltage at the first input node 208 during a first reading time period, and to decouple the current source 202 from the first input node 208 during a second reading time period, wherein the comparator circuit 206 is configured to operate during a third reading time period upon application of an enable signal at the enable node 214 of the comparator circuit 206, at least one memory cell access switch 216 to enable a current flow through a memory cell or to disable a current flow through a memory cell, wherein the at least one memory cell access switch 216 is configured to allow a current flow at least partially during the second and the third reading time periods through the memory cell, and wherein the comparator circuit 206 is further configured to compare a voltage applied to the first input node 208 with a reference voltage applied to the second input node 210 and to determine a programming state of the memory cell based on the voltage present at the first input node 208 during the third reading time period.

In FIG. 2A, the line represented as 218 is illustrated to show the relationship among the first input node 208, the second input node 210, the output node 212 and the enable node 214 of the comparator circuit 206, which may include electrical coupling and/or mechanical coupling, while the line represented as 220 is illustrated to show the relationship among the current source 202, the precharge switch 204, the comparator circuit 206 and the at least one memory cell access switch 216, which may include electrical coupling and/or mechanical coupling.

In other words, the reading circuit 200 includes a current source 202 [CS 320] and a precharge switch 204 [M2 312] coupled to each other, and a comparator circuit 206 [latch 330] having a first input node (in-node1) 208 [331], a second input node (in-node2) 210 [332], an output node (out-node) 212 [333] and an enable node (EN-node) 214 [334], where the precharge switch 204 may be coupled to the comparator circuit 206 such that a coupling path may be established through the current source 202, the precharge switch 204 and the comparator circuit 206. The first input node 208 may refer to an input for receiving a signal, while the second input node 210 may refer to an input for receiving a reference voltage, $V_{ref}$. The precharge switch 204 may be coupled to the first input node 208 of the comparator circuit 206. The current source 202 may provide an electrical signal (e.g. a current, I), where based on this electrical signal and via the precharge switch 204, a precharge voltage, $V_{precharge}$, may be applied at the first input node 208 during or in a first reading time period. During or in a second reading time period, the current source 202 may be decoupled from the first input node 208 using the precharge switch 204, such that no precharge voltage is applied to the the first input node 208. This may mean that the precharge switch 204 may be employed to control the electrical communication between the current source 202 and the comparator circuit 206.

In the context of various embodiments, the precharge voltage, $V_{precharge}$, may be the read voltage, $V_{read}$, e.g. the voltage applied for reading a memory cell.

The comparator circuit 206 may also be operable during a third reading time period upon application of an enable (EN) signal at the enable node 214 of the comparator circuit 206. The reading circuit 200 may further include at least one memory cell access switch 216 [M5 315] to enable a current flow through a resistive memory cell or to disable a current flow through a resistive memory cell, where the memory cell access switch 216 may allow a current flow through the resistive memory cell during a part of or the entire second reading time period, and/or a part of or the entire third reading time period. This may mean that the memory cell access switch 216 may control access to the resistive memory cell.

A reference voltage ($V_{ref}$) may be applied to the second input node 210 of the comparator circuit 206, where the comparator circuit 206 may be configured to compare a voltage applied to the first input node 208 with $V_{ref}$ applied to the second input node 210 and to determine a programming state of the resistive memory cell based on the voltage present at the first input node 208 during the third reading time period.

The first reading time period, the second reading time period and the third reading time period are different reading time periods. For example, the first reading time period, the second reading time period and the third reading time period may be sequential reading time periods, with or without intervening time periods therebetween the first reading time period and the second reading time period, and/or therebetween the second reading time period and the third reading time period.

In the context of various embodiments, the reading circuit 200 may be employed for reading or determining the programming state of a memory cell, for example for determining the information stored in the memory cell.

In the context of various embodiments, the term "current source" may include, for example, a direct or indirect current source, or a current mirror, or a constant or variable current source, or a voltage bias.

In the context of various embodiments, the term "comparator circuit" may include, for example, a latch.

In the context of various embodiments, the term "resistive memory cell" may include a memory cell of any kind which may be switched between two or more states exhibiting different resistivity values. The resistive memory cell may be but not limited to a resistive random-access memory (RRAM) cell, which may have a metal-insulator-metal (M-I-M) configuration, for example having a dielectric layer arranged in between a bottom electrode (BE) and a top electrode (TE). In the context of various embodiments, the dielectric layer may include a resistive changing material which may change its resistance as a result of a change in its resistivity.

In the context of various embodiments, the reading circuit 200 may also be employed for other types of resistive memory cells including but not limited to a phase change random-access memory (PCRAM) cell, a conductive bridging random-access memory (CBRAM) cell, a magnetoresistive random-access memory (MRAM) cell or a redox-based resistive switching memory cell.

In various embodiments, the programming state of the memory cell may include a first programming state and a second programming state. The first programming state and the second programming state may indicate the different states of the memory cell or the different information stored in the memory cell.

In various embodiments, the voltage at the first input node 208 of the comparator circuit 206 which corresponds to the first programming state of the memory cell may be the precharge voltage, $V_{precharge}$.

In various embodiments, the voltage at the first input node 208 of the comparator circuit 206 which corresponds to the second programming state may be obtained by multiplying the current, I, provided by the current source 202 and a resistance, R, of the memory cell at the second programming state.

In various embodiments, the voltage at the first input node 208 of the comparator circuit 206 which corresponds to the second programming state may be larger than a first value obtained by multiplying the current, I, provided by the current source 202 and a resistance, R, of the memory cell at the second programming state, and may be smaller than a second value equal to a difference between the reference voltage, $V_{ref}$, and a voltage margin, $V_{margin}$, provided at the first input node 208 of the comparator circuit 206 to avoid or minimise any uncertainty results caused by noise, offset, etc. In other words, the voltage at the first input node 208, $V_{in\text{-}node1}$, may have the relationship $(I \times R) < V_{in\text{-}node1} < (V_{ref} - V_{margin})$. It should be appreciated that $V_{margin}$ may not be a physical input signal. In various embodiments, the value of $(I \times R)$ may be much smaller than the value of $(V_{ref} - V_{margin})$, i.e. $(I \times R) <<$ $(V_{ref} - V_{margin})$. $V_{margin}$ refers to the requirement of a minimum comparator circuit input voltage difference when considering input noise and offset. In other words, the comparator circuit 206 may have a minimum voltage, in the form of $V_{margin}$, at its input for compensating for noise and offset. It is zero (i.e. $V_{margin}=0$) in an ideal comparator.

In various embodiments, the reference voltage, $V_{ref}$, may have a value equal to a difference between the precharge voltage, $V_{precharge}$, and the voltage margin, $V_{margin}$, provided at the input of the comparator circuit 206 to avoid or minimise any uncertainty results caused by noise, offset, etc., i.e. $V_{ref} = (V_{precharge} - V_{margin})$.

In the context of various embodiments, $V_{margin}$ may be in a range of about 0.01 V to about 0.1 V, for example a range of about 0.01 V to about 0.05 V, a range of about 0.05 V to about 0.1 V, or a range of about 0.02 V to about 0.04 V.

In the context of various embodiments, the first programming state of the memory cell may be indicative of a high resistance (HR; $R_H$) state of the memory cell and the second programming state of the memory cell may be indicative of a low resistance (LR; $R_L$) state of the memory cell.

In various embodiments, the comparator circuit 206 may be configured to output at the output node 212, a first value (output value) when the first programming state may be determined and a second value (output value) when the second programming state may be determined. The first value may be 1 and the second value may be 0.

In various embodiments, the reading circuit 200 may further include a current mirror including a first transistor [M0 310] having a first node [$N_1$], a second node [$N_2$] and a gate node [G] and a second transistor [M1 311] having a first node [$N_1$], a second node [$N_2$] and a gate node [G], wherein the current source 202 includes an input node [in-node 322] and an output node [out-node 324], wherein the precharge switch 204 [M2 312] includes a first node [$N_1$], a second node [$N_2$] and a gate node [G], wherein the input node of the current source 202 may be coupled to the second node and the gate node of the first transistor and the gate node of the second transistor, and the output node of the current source 202 may be coupled to a first voltage point (e.g. $V_1$), wherein the first node of the first transistor, the first node of the second transistor and the first node of the precharge switch may be coupled to a second voltage point (e.g. $V_2$). In various embodiments, the current source 202 may be part of the current mirror.

In the context of various embodiments, the term "current mirror" may mean a circuit that serves as a current regulator, where the current flowing in one half or branch of the circuit may be used to control the current flow in the other half or branch of the circuit. The current amplitude flowing through both halves or branches may have a ratio relationship, for example 1:1, 1:2, 2:1, etc.

In the context of various embodiments, the first voltage point, $V_1$, may be a ground terminal. In the context of various embodiments, the second voltage point, $V_2$, may be a power supply line (e.g. VDD), for example at a potential at least substantially similar to a read voltage, $V_{read}$.

In various embodiments, the reading circuit 200 may further include a first read enable switch [M3 313] and a second read enable switch [M6 316] respectively including a first node [$N_1$], a second node [$N_2$] and a gate node [G], and wherein the memory cell access switch 216 [M5 315] includes a first node [$N_1$], a second node [$N_2$] and a gate node [G], wherein the first node of the first read enable switch may be coupled to the second node of the second transistor, wherein the first node of the second read enable switch may be coupled to the second node of the memory cell access switch 216, and the second node of the second read enable switch may be coupled to the first voltage point, $V_1$, and wherein the first node of the memory cell access switch 216 may be coupled to a first end of the memory cell. In alternative embodiments, the second node of the second read enable switch may be coupled to a third voltage point (e.g. $V_3$), which may or may not be at the same potential as the first voltage point, $V_1$.

In the context of various embodiments, a memory cell may be accessed or addressed by its row-number and column-number. The rows may also be known as the word lines and the columns may also be known as the bit lines.

In various embodiments, the reading circuit 200 may further include a column selecting switch [M4 314] including a first node [$N_1$], a second node [$N_2$] and a gate node [G], wherein the first node of the column selecting switch may be coupled to the second node of the precharge switch 204. The column selecting switch may select the column corresponding to the memory cell to be accessed.

In various embodiments, the second node of the first read enable switch and the second node of the column selecting switch may be coupled to a second end of the memory cell.

In various embodiments, the second node of the first read enable switch may be coupled to the second node of the precharge switch 204, and wherein the second node of the column selecting switch may be coupled to a second end of the memory cell. Such an arrangement may reduce the noise on one or more unselected bit lines.

In various embodiments, the reading circuit 200 may further include a third transistor [M7 317] including a first node [$N_1$], a second node [$N_2$] and a gate node [G], wherein the first node of the third transistor may be coupled to the first input node 208 of the comparator circuit 206, wherein the second node of the third transistor may be coupled to the second node of the column selecting switch, and wherein the gate node of the third transistor may be coupled to the gate node of the column selecting switch.

In various embodiments, the memory cell access switch 216 may be a row selecting switch, for selecting the row corresponding to the memory cell to be accessed.

In various embodiments, the precharge switch 204, the memory cell access switch 216, the first read enable switch, the second read enable switch and the column selecting switch may be or may include transistors.

In the context of various embodiments, it should be appreciated that any one or more of or each of the precharge switch 204, the memory cell access switch 216, the first read enable switch, the second read enable switch and the column selecting switch may be or may include a transistor.

In the context of various embodiments, the term "transistor" may mean a bipolar junction transistor (BJT) or a field effect transistor (FET), such as one of a metal oxide semiconductor field effect transistor (MOSFET) (e.g. an n-channel MOS transistor (NMOS); a p-channel MOS transistor (PMOS)), a metal-insulator field effect transistor (MISFET) or a metal-semiconductor field effect transistor (MESFET).

In the context of various embodiments, any one of or each of the first transistor and the second transistor may be or may include a p-type metal oxide semiconductor field effect transistor (e.g. PMOS transistor).

In the context of various embodiments, any one of or each of the precharge switch 204, the first read enable switch, the column selecting switch, the memory cell access switch 216, the second read enable switch and the third transistor may be or may include an n-type metal oxide semiconductor field effect transistor (e.g. NMOS transistor).

In the context of various embodiments, a transistor (e.g. NMOS or PMOS) having a first node, a second node and a gate node or where a switch having a first node, a second node and a gate node may be or may include a transistor (e.g. NMOS or PMOS), the first node may be a first source/drain terminal, the second node may be a second source/drain terminal, and the gate node may be a gate terminal.

In the context of various embodiments, the term "source/drain terminal" of a transistor may refer to a source terminal or a drain terminal. As the source terminal and the drain terminal of a transistor are generally fabricated such that these terminals are geometrically symmetrical, these terminals may be collectively referred to as source/drain terminals. In various embodiments, a particular source/drain terminal may be a "source" terminal or a "drain" terminal depending on the voltage to be applied to that terminal. Accordingly, the terms "first source/drain terminal" and "second source/drain terminal" may be interchangeable.

In the context of various embodiments, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a 'circuit' in accordance with an alternative embodiment.

In the context of various embodiments, the terms "couple" and "coupled" may include electrical coupling and/or mechanical coupling.

In the context of various embodiments, the terms "couple" and "coupled" with regard to two or more components may include direct coupling and/or indirect coupling. For example, two components being coupled to each other may mean that there is a direct coupling path between the two components and/or there is an indirect coupling path between the two components, e.g. via one or more intervening components (e.g. resistor and/or inductor and/or capacitor) connected therebetween.

Figure 3:
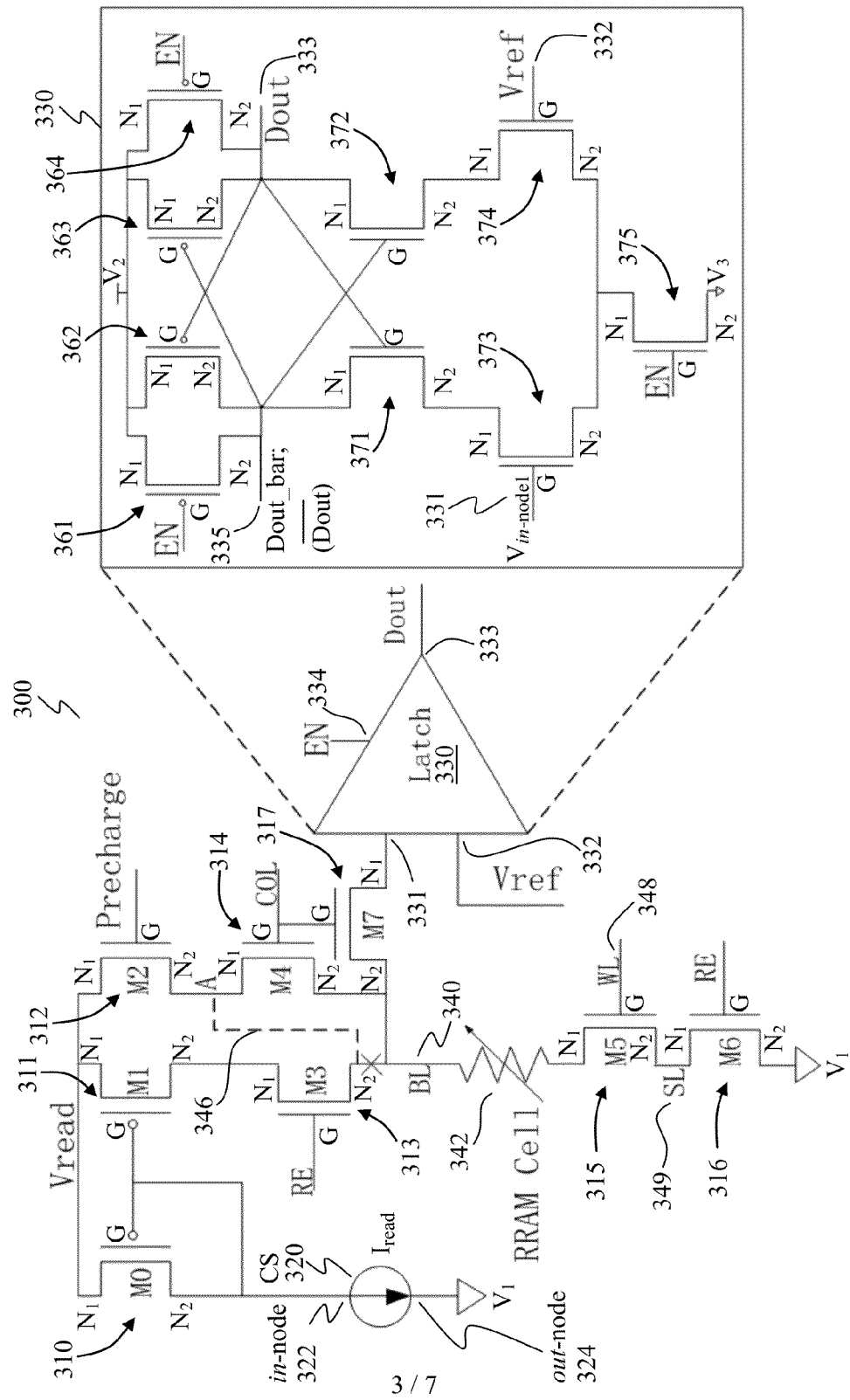
FIG. 3 shows a schematic of a reading circuit for a resistive memory cell, according to various embodiments.

FIG. 3 shows a schematic of a reading circuit 300 for a resistive memory cell, according to various embodiments. The reading circuit 300 may include or employ a low resistance side sensing scheme for reading out small current signals. For ease of understanding and clarity, the reading circuit 300 is shown for one memory cell (e.g. RRAM cell) 342.

The reading circuit 300 may include a current source, CS, 320, a precharge switch which may be in the form of a transistor (e.g. NMOS) M2 312, a comparator circuit which may be in the form of a latch 330, and a memory cell access switch which may be in the form of a transistor (e.g. NMOS) M5 315. The current source 320 may provide a biased current $I_{read}$ (or $I_{sense}$). In various embodiments, $I_{read}$ may be at least substantially fixed or constant.

The reading circuit 300 may further include a first transistor (e.g. PMOS) M0 310, a second transistor (e.g. PMOS) M1 311, a first read enable switch which may be in the form of a transistor (e.g. NMOS) M3 313, a column selecting switch which may be in the form of a transistor (e.g. NMOS) M4 314, a second read enable switch which may be in the form of a transistor (e.g. NMOS) M6 316, and a third transistor (e.g. NMOS) M7 317.

Each of the first transistor M0 310, second transistor M1 311, precharge switch M2 312, first read enable switch M3 313, column selecting switch M4 314, memory cell access switch M5 315, second read enable switch M6 316, and third transistor M7 317 respectively may have a first node ($N_1$), a second node ($N_2$) and a gate node (G). The current source 320 may include an input node (in-node) 322 and an output node (out-node) 324. The latch 330 may have a first input node (in-node1) 331, a second input node (in-node2) 332, an output node (out-node) 333 and an enable node (EN-node) 334.

As shown in FIG. 3, the current source 320, the first transistor M0 310, the second transistor M1 311, the precharge switch M2 312, the first read enable switch M3 313, the column selecting switch M4 314, the memory cell access switch M5 315, the second read enable switch M6 316 and the third transistor M7 317 may be arranged on the input side of the latch 330, or in other words arranged before the latch circuit 330.

The respective first nodes ($N_1$) of each of the first transistor M0 310, second transistor M1 311 and precharge switch M2 312 may be coupled together, and coupled to a voltage point, which may be at a potential at least substantially same as the read voltage, $V_{read}$. The second node ($N_2$) of the first transistor M0 310 may be coupled together with the respective gate nodes (G) of each of the first transistor M0 310 and the second transistor M1 311. The second node ($N_2$) of the first transistor M0 310 may also be coupled to the input node 322 of the current source 320. The output node 324 of the current source 320 may be coupled to a voltage point, $V_1$. The voltage point, $V_1$, may be grounded. The first transistor M0 310 and the second transistor M1 311, with the current source 320, may form a current mirror.

The second node ($N_2$) of the precharge switch M2 312 may be coupled to the first node ($N_1$) of the column selecting switch M4 314, while the gate node (G) of the precharge switch M2 312 may receive a "precharge" signal.

The respective second nodes ($N_2$) of each of the column selecting switch M4 314 and the third transistor M7 317 may be coupled together, and the respective gate nodes (G) of each of the column selecting switch M4 314 and the third transistor M7 317 may be coupled together, and which may receive a column selecting or address signal, "COL". The respective second nodes ($N_2$) of each of the column selecting switch M4 314 and the third transistor M7 317 may be further coupled, via a bit line (BL) or a bit line (BL) node 340, to the memory cell (e.g. RRAM cell) 342. The first node ($N_1$) of the third transistor M7 317 may be coupled to the first input node 331 of the latch 330.

The second node ($N_2$) of the second transistor M1 311 may be coupled to the first node ($N_1$) of the first read enable switch M3 313. The gate node (G) of the first read enable switch M3 313 may receive a read enable signal, "RE". In various embodiments, the second node ($N_2$) of the first read enable switch M3 313 may be coupled via the bit line (BL) 340 to a memory cell 342. This may mean that the second node ($N_2$) of the first read enable switch M3 313 may also be coupled to the respective second nodes ($N_2$) of the column selecting switch M4 314 and the third transistor M7 317.

In further embodiments, the second node ($N_2$) of the first read enable switch M3 313 may be coupled together with the second node ($N_2$) of the precharge switch M2 312 and the first node ($N_1$) of the column selecting switch M4 314, for example as indicated by the dashed path 346 to point "A" as shown in FIG. 3, rather than coupled to the bit line (BL) 340 (as indicated by a "x" near the second node ($N_2$) of the first read enable switch M3 313 for indicating the absence of connection between the second node ($N_2$) of the first read enable switch M3 313 and the bit line (BL) 340), while the respective second nodes ($N_2$) of each of the column selecting switch M4 314 and the third transistor M7 317 may be coupled, via the bit line (BL) 340, to the memory cell 342.

The bit line (BL) 340 may be coupled to one end or one terminal of the memory cell 342, while another end or another terminal of the memory cell 342 may be coupled to the first node ($N_1$) of the memory cell access switch M5 315. The gate node (G) of the memory cell access switch M5 315 may be coupled to a word line (WL) 348, which may receive a voltage from a power supply line (e.g. VDD). The second node ($N_2$) of the memory cell access switch M5 315 may be coupled together with the first node ($N_1$) of the second read enable switch M6 316, and further coupled to a source line (SL) or a source line (SL) node 349. The gate node (G) of the second read enable switch M6 316 may receive a read enable signal, "RE", at least substantially similar to that received by the gate node (G) of the first read enable switch M3 313. This may mean that the read enable signal, "RE", may control the operations of the first read enable switch M3 313 and the second read enable switch M6 316, for example allowing a current flow through the first read enable switch M3 313 and the second read enable switch M6 316, as well as through the memory cell 342 sandwiched therebetween. The second node ($N_2$) of the second read enable switch M6 316 may be coupled to the voltage point, $V_1$.

The memory cell 342 has a variable resistance, which may vary as a result of changes in its resistivity. This may mean that the memory cell 342 may have different resistance states or programming states, which respectively may indicate the information present in the memory cell 342.

The second input node 332 of the latch 330 may receive a voltage, for example a reference voltage, $V_{ref}$. The latch 330 may output a signal, $D_{out}$, at the $D_{out}$ output node 333 based on the respective voltages present at the first input node 331 (e.g. $V_{in-node1}$) and the second input node 332 (e.g. $V_{in-node2}=V_{ref}$). The enable node 334 of the latch 330 may receive an enable signal, "EN", which may control the operation of the latch 330.

As a non-limiting example, the latch 330 may be a low power latch and may include a first PMOS transistor 361, a second PMOS transistor 362, a third PMOS transistor 363, a fourth PMOS transistor 364, a first NMOS transistor 371, a second NMOS transistor 372, a third NMOS transistor 373, a fourth NMOS transistor 374, and a fifth NMOS transistor 375. Each of the first PMOS transistor 361, second PMOS transistor 362, third PMOS transistor 363, fourth PMOS transistor 364, first NMOS transistor 371, second NMOS transistor 372, third NMOS transistor 373, fourth NMOS transistor 374, and fifth NMOS transistor 375 respectively has a first node ($N_1$), a second node ($N_2$) and a gate node (G).

The respective first node ($N_1$) of each of the first PMOS transistor 361, second PMOS transistor 362, third PMOS transistor 363, and fourth PMOS transistor 364 are coupled together, and coupled to a voltage point, $V_2$. The voltage point, $V_2$, may be a power supply line (e.g. $V_2$=VDD).

The second node ($N_2$) of the first PMOS transistor 361 may be coupled to the second node ($N_2$) of the second PMOS transistor 362, the gate node (G) of the third PMOS transistor 363 and the gate node (G) of the second NMOS transistor 372, while the second node ($N_2$) of the fourth PMOS transistor 364 may be coupled to the second node ($N_2$) of the third PMOS transistor 363, the gate node (G) of the second PMOS transistor 362 and the gate node (G) of the first NMOS transistor 371. The second node ($N_2$) of the first PMOS transistor 361 may also be coupled to an output node (e.g. $D_{out}$_bar output node) 335, which may output a signal, $D_{out}$_bar. The second node ($N_2$) of the fourth PMOS transistor 364 may also be coupled to the output node (e.g. $D_{out}$ output node) 333, which may output a signal, $D_{out}$. The signals, $D_{out}$ and $D_{out\_}$bar, are "NOT" equivalents of each other. The respective gate nodes (G) of each of the first PMOS transistor 361 and the fourth PMOS transistor 364 may receive the enable signal, "EN". This may mean that the enable signal, "EN" may be employed to control the operation of the respective gate nodes and hence the respective operations of the first PMOS transistor 361 and the fourth PMOS transistor 364.

The second node ($N_2$) of the second PMOS transistor 362 and the first node ($N_1$) of the first NMOS transistor 371 may be coupled together, while the second node ($N_2$) of the third PMOS transistor 363 and the first node ($N_1$) of the second NMOS transistor 372 may be coupled together.

The second node ($N_2$) of the first NMOS transistor 371 and the first node ($N_1$) of the third NMOS transistor 373 may be coupled together. The second node ($N_2$) of the second NMOS transistor 372 and the first node ($N_1$) of the fourth NMOS transistor 374 may be coupled together. The gate node (G) of the third NMOS transistor 373 may correspond to the first input node 331, and which may receive a voltage, $V_{in-node1}$. The gate node (G) of the fourth NMOS transistor 374 may correspond to the second input node 332, and which may receive the reference voltage, $V_{ref}$.

The respective second nodes ($N_2$) of the third NMOS transistor 373 and the fourth NMOS transistor 374 may be coupled together, and further coupled to the first node ($N_1$) of the fifth NMOS transistor 375. The gate node (G) of the fifth NMOS transistor 375 may receive the enable signal, "EN", which may control the operation of the gate node (G) and hence the operation of the fifth NMOS transistor 375. The second node ($N_2$) of the fifth NMOS transistor 375 may be coupled to a voltage point, $V_3$. The voltage point, $V_3$, may be at a potential at least substantially same as the voltage point, $V_1$. The voltage point, $V_3$, may be grounded.

The current source 320, suppling a biased current, $I_{read}$, and the first transistor M0 310 may be in a reference current path. Only one current source 320 and one first transistor M0 310 pair may be required for a whole memory bank, or in other words, a memory array or arrangement having a plurality of memory cells may share a single pair of one current source 320 and one first transistor M0 310. A respective second transistor M1 311, a respective precharge switch M2 312, a respective first read enable switch M3 313, a respective column selecting switch M4 314, a respective memory cell access switch M5 315, and a respective second read enable switch M6 316 may be required for every column in the memory array.

The second transistor M1 311 may be used to mirror the reference current, $I_{read}$, that flows through the reference current path. The first read enable switch M3 313 is in the same current path as the second transistor M1 311. The latch 330 may only be active when the read enable signal, RE, is "high" and the first read enable switch M3 313 is turned on.

While the second node ($N_2$) (e.g. source terminal) of the first read enable switch M3 313 may be coupled, e.g. directly coupled, to the bit line (BL) 340, in various embodiments, the second node ($N_2$) (e.g. source terminal) of the first read enable switch M3 313 may be disconnected from the bit line (BL) 340 and connected to node "A", which may reduce the noise on unselected bit lines.

The precharge switch M2 312 is the switch for precharge, for example to provide a precharge voltage, $V_{precharge}$, to the first input node 331 of the latch 330. $V_{precharge}$ may be $V_{read}$. The column selecting switch M4 314 may serve to select the column through which one or more memory cells, e.g. 342, may be accessed. The memory cell access switch M5 315 may serve as a row selecting switch to select the row through which one or more memory cells, e.g. 342, may be accessed. The second read enable switch M6 316 may be used to pull the SL node 349 to ground. The third transistor M7 317 may be used to share the latch 330 among different columns. In embodiments where a dedicated latch is used, the third transistor M7 317 may be removed. In other words, where a dedicated latch is provided for each column, the third transistor M7 317 may not be necessary.

Each of the precharge switch M2 312, first read enable switch M3 313 and column selecting switch M4 314 may use an NMOS type transistor, for example as shown for the reading circuit 300 illustrated in FIG. 3. However, it should be appreciated that each of the precharge switch M2 312, first read enable switch M3 313 and column selecting switch M4 314 may be a PMOS type transistor, depending on the reading signal strength. Where PMOS type transistors are used, the control signal precharge applied to the gate node (G) of the precharge switch M2 312, the read enable signal (RE) and the column address signal (COL) may be active low signals.

During reading, a precharge signal applied to the gate node (G) of the precharge switch M2 312 may cause the reading circuit 300 to charge the bit line (BL) 340 to $V_{read}$ to obtain a high reading current. As different reading voltages, $V_{read}$, may cause a change of the memory cell or RRAM resistance, R, to different values according to the relationship of $R \approx e^{-kv}$, where k is the fitting parameter, and v is the reading voltage, a high $V_{read}$ value may result in a low R and a high read current through the memory cell 342. Generally, a strong signal may help to achieve high signal-to-noise ratio (SNR), fast reading speed and accurate results. Nevertheless, in order to prevent, or at least minimise, from read disturbance, the reading voltage, $V_{read}$, should be much smaller than the writing voltage. After the bit line (BL) 340 is charged to $V_{read}$ and the precharge signal is disabled, the reading circuit 300 may be analyzed in two conditions: high resistance ($R_H$) state and low resistance ($R_L$) state, as shown in FIG. 4.

Figure 4:
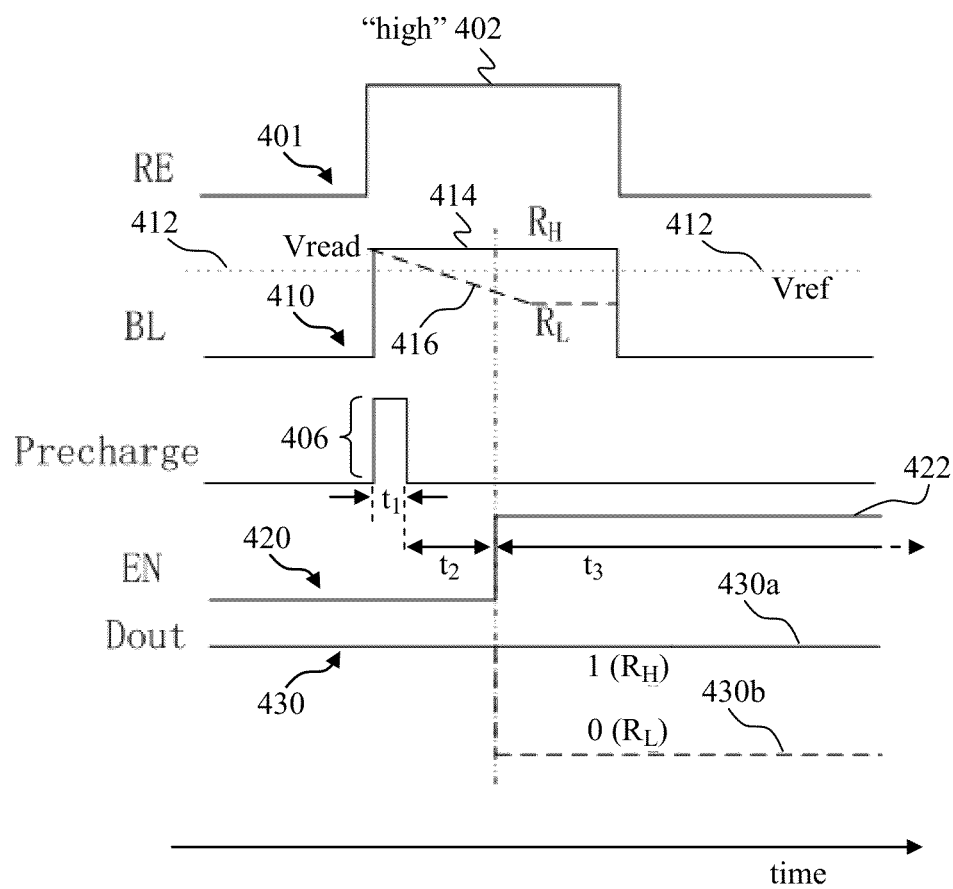
FIG. 4 shows a schematic of the timing waveforms for the respective control signals, according to various embodiments.

FIG. 4 shows a schematic of the timing waveforms for the respective control signals, according to various embodiments. For a reading operation, a read enable signal, RE, as represented by the waveform 401, that is "high" 402, may be applied to the respective gate nodes (G) of the first read enable switch M3 313 and the second read enable switch M6 316 to turn on both the first read enable switch M3 313 and the second read enable switch M6 316. As a result of the switching on of the first read enable switch M3 313, the latch 330 may become activated.

At approximately the same time as the application of the "high" RE 402, a precharge signal, Precharge 406, may be applied to the the gate node (G) of the precharge switch M2 312 to turn on the precharge switch M2 312. The precharge signal, Precharge 406 may be applied for a first reading time period, $t_1$. As a result, the precharge switch M2 312 may couple the current source 320 to the first input node 331 of the latch 330 such that the current provided by the current source 320 is provided to the first input node 331 to apply a precharge voltage, $V_{precharge}$, at the first input node 331 during the first reading time period, $t_1$. The precharge voltage, $V_{precharge}$, may be the read voltage, $V_{read}$. In addition, the voltage, as represented by waveform 410, at the bit line (BL) 340 may be increased to the read voltage, $V_{read}$. The read voltage, $V_{read}$, is higher than a reference voltage, $V_{ref}$ 412, that may be applied to the second input node 332 of the latch 330. After the bit line (BL) 340 is charged to $V_{read}$, the precharge signal, Precharge 406, may be removed. As a result, the precharge switch M2 312 may be switched off, thereby decoupling the current source 320 from the first input node 331 of the latch 330, during a second reading time period, $t_2$, and any subsequent reading time period.

During a third reading time period, $t_3$, an enable signal (EN), as represented by the waveform 420, that is "high" 422, may be applied at the enable node 334 of the latch 330 so that the latch 330 may be operable to compare a voltage applied to the first input node 331 with the reference voltage, $V_{ref}$ 412, applied to the second input node 332 and to determine a programming or resistance state of the memory cell 342 based on the voltage present at the first input node 331 during the third reading time period, $t_3$. Based on the comparison, the latch 330 may output an output signal, $D_{out}$, as represented by waveform 430, at the output node 333, for example $D_{out}$=1, as indicated by 430a, for the high resistance ($R_H$) state and $D_{out}$=0, as indicated by 430b, for the low resistance ($R_L$) state. Subsequently, the enable signal (EN) 420 may become "low" until the next reading operation.

With regard to the operation of the latch 330, when EN is "low", both $D_{out}$ output node 333 and $D_{out\_bar}$ output node 335 may be pulled to $V_2$. In order to sense the difference between $V_{in\text{-}node1}$ at the first input node 331 and $V_{ref}$ at the second input node 332, EN may be raised to "high"(e.g. "high" 422). The different respective input voltages of $V_{in\text{-}node1}$ and $V_{ref}$ may result in different discharge speeds on the $D_{out}$ output node 333 and the $D_{out\_bar}$ output node 335. A higher input voltage, either $V_{in\text{-}node1}$ or $V_{ref}$, may lead to a faster discharge speed, and as a result, the corresponding output node, either $D_{out}$ output node 333 or $D_{out\_bar}$ output node 335, in that path may be pulled to ground. For example, where $V_{in\text{-}node1} > V_{ref}$, the $D_{out\_bar}$ output node 335 may be pulled to ground. As a result, the second NMOS transistor 372 may be turned off. Meanwhile, the third PMOS transistor 363 may be turned on by a low Dout_bar, and as a result, the $D_{out}$ output node may be pulled to $V_2$, which may be equivalent to VDD.

In the $R_H$ state (e.g. "1"), the weak reference current, $I_{read}$, which may be slightly higher than $V_{read}/R_H$, may cause or force the BL node 340 to hold the voltage at approximately $V_{read}$, as indicated by 414. In the $R_L$, state (e.g. "0"), the reference current, $I_{read}$, may be much weaker than the discharge current from BL 340 to SL 349, and as a result, the voltage 410 at the BL node 340 may be pulled down to $I_{read} \times R_L$, as indicated by 416, from $V_{read}$. When ($I_{read} \times R_L$) 416 is less than the reference voltage, $V_{ref}$ 412, the memory cell (RRAM) 342 may be considered to be in the $R_L$ state. Otherwise, the memory cell (RRAM) 342 may be considered to be in the $R_H$ state.

As $R_H$ and $R_L$ may have more than two orders difference, in terms of resistance values, $I_{read}$ may be set to the logarithmic middle point. In such a design, $R_H$ always has the same voltage $V_{read}$ applied, meaning that in the $R_H$ state, at least substantially same voltage of $V_{read}$ may be maintained. Thus, the distribution of $R_H$ (resistance value) may be minimized.

As described above, the voltage at the first input node 331 of the latch 330 to be compared to $V_{ref}$ 412 may be the precharge voltage or $V_{read}$ when the memory cell 342 is in the $R_H$ state. The voltage at the first input node 331 of the latch 330 to be compared to $V_{ref}$ 412 may be at least substantially same as ($I_{read} \times R_L$) when the memory cell 342 is in the $R_L$ state. However, it should be appreciated that in another embodiment, the voltage at the BL node 340, as well as at the first input node 331 of the latch 330, when the memory cell is in the $R_L$ state, may be another value, which may be larger than ($I_{read} \times R_L$) but smaller than ($V_{ref} - V_{margin}$). Therefore, the reading speed may be much faster. In this case, $V_{ref}$ 412 may be set to ($V_{read} - V_{margin}$). The voltage at the BL node 340 may be larger than ($I_{read} \times R_L$) but smaller than ($V_{ref} - V_{margin}$) for at least the reasons that ($I_{read} \times R_L$) may be much smaller than ($V_{ref} - V_{margin}$) and also due to discharge, the voltage on the memory cell 342 may get smaller and its resistance, R, may get larger, and thus the RC constant (resistance×capacitance) may get larger. $V_{margin}$ may be set large enough (e.g. 0.1V) so as to avoid, or at least minimise, the effect from distribution, noise, charge injection and resolution of the latch comparator 330. The reference voltage, $V_{ref}$ 412, to be sensed by the latch 330 may be set to be ~0.01–0.1 V lower than $V_{read}$, in order to provide enough margin or buffer accounting for noise. A lower latch input voltage margin (e.g. lower $V_{margin}$) may lead to a faster sensing speed but suffers from a smaller SNR, while on the other hand, a higher latch input voltage margin (e.g. higher $V_{margin}$) may result in more accurate output data but a longer reading time. In various embodiments, the $R_L$ (resistance value) distribution may lead to different discharge speeds due to different RC values, and so the sensing time may be changed.

It should be appreciated that for determining the programming or resistance state of a memory cell, e.g. 342, the corresponding column selecting switch, e.g. M4 314, and memory cell access switch (row selecting switch), e.g. M5 315, may be switched on to enable access to the memory cell. The third transistor M7 317 may also be switched for applying a voltage to the first input node 331 of the latch 330.

In various embodiments, fully dynamic latches may be used in the reading circuit 300 to sense the signal or voltage in the bit line (BL), e.g. 340, where a non-limiting example of such a latch may be as shown in FIG. 3. The latch 330 may only consume dynamic power during the sensing period (e.g. during the third reading time period, $t_3$, or a part thereof), and then the latch 330 may be turned off immediately to save power. The latch 330 may be controlled by the enable signal (EN) 420 and the latch 330 may be enabled at least until ($I_{read} \times R_L$) is smaller than $V_{ref}$, as shown in FIG. 4. The EN signal 420 may then be low until the next reading or writing pulse goes to "high".

Figure 5A:
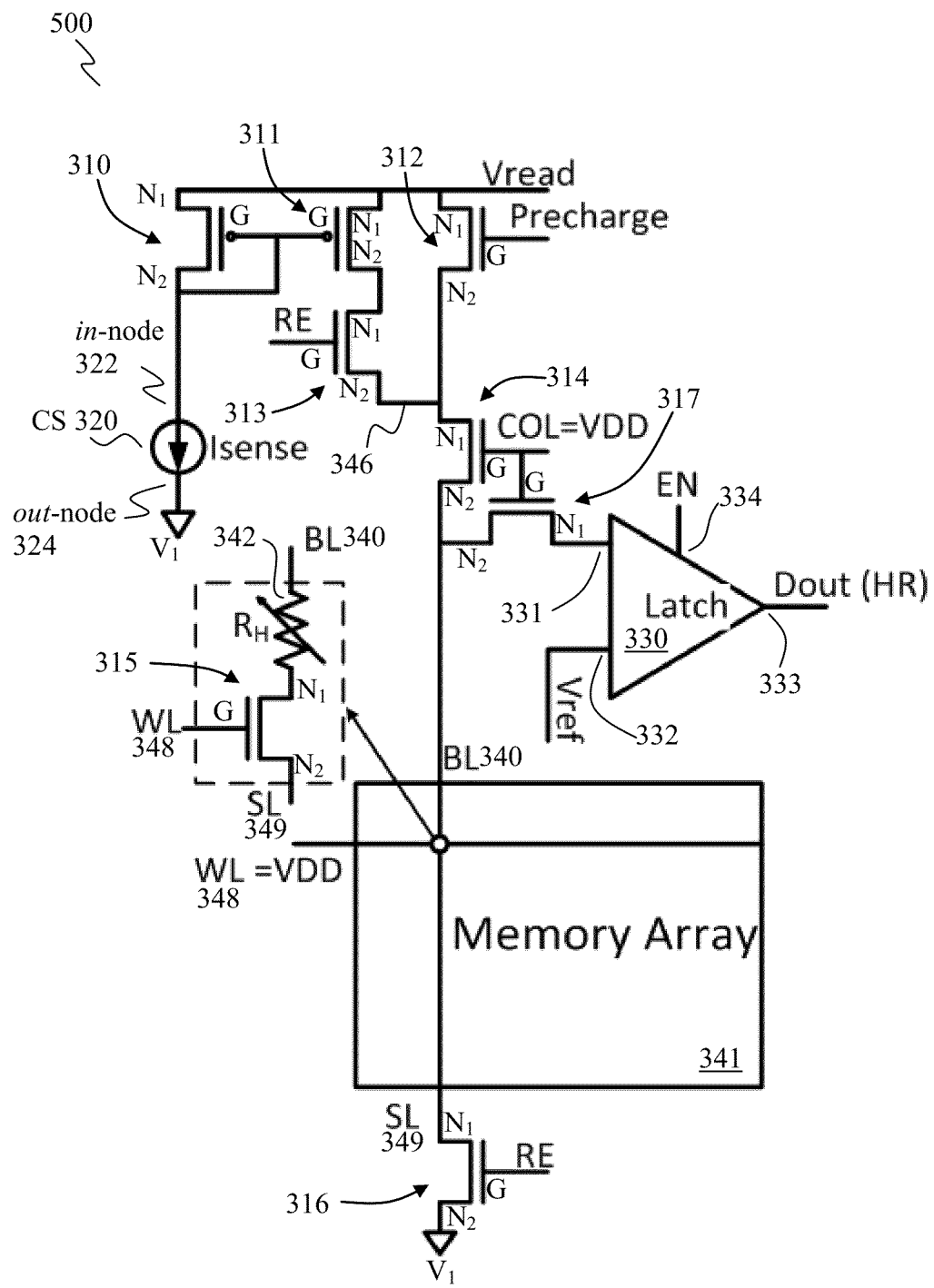
FIGS. 5A and 5B show respective test benches for reading circuits for testing high resistance sensing and low resistance sensing respectively, according to various embodiments.
Figure 5B:
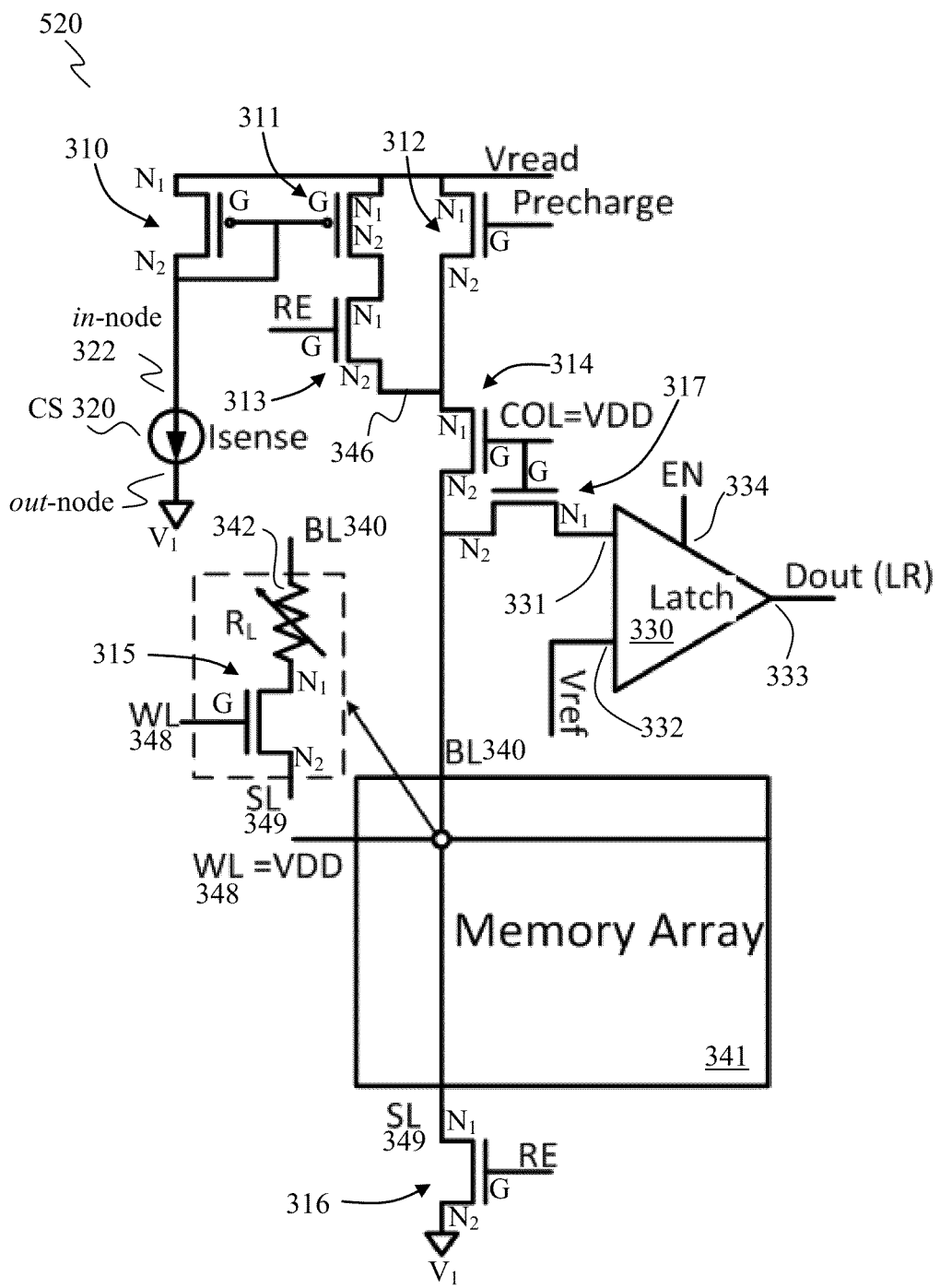
Figure 6:
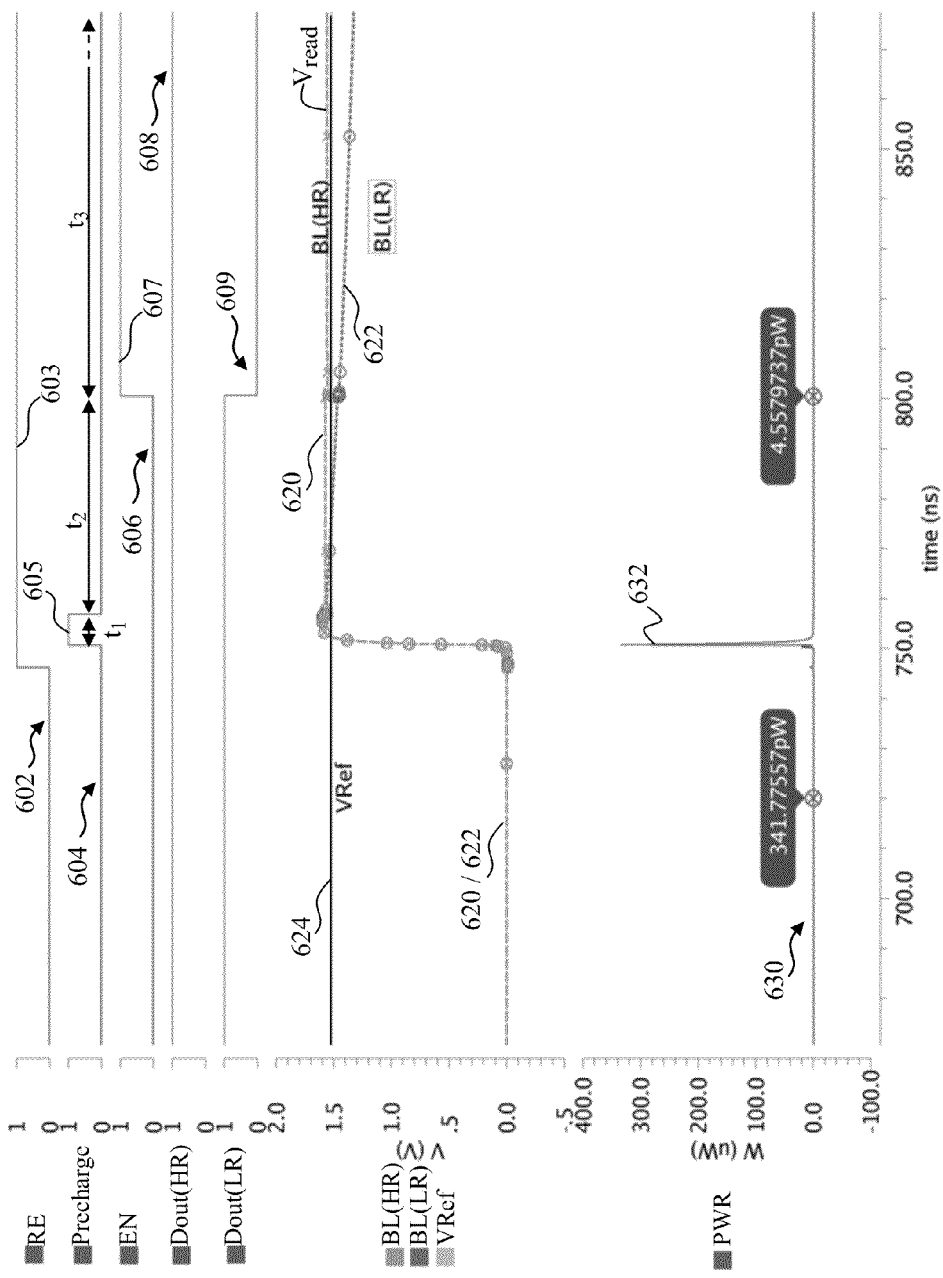
FIG. 6 shows simulation results for a reading circuit, according to various embodiments

FIGS. 5A and 5B show respective test benches 500, 520, for reading circuits for testing high resistance sensing and low resistance sensing respectively, according to various embodiments, while FIG. 6 shows simulation results for a reading circuit, according to various embodiments, based on the test benches 500, 520 of the embodiments of FIGS. 5A and 5B respectively. The test bench 500 includes a read 1 (high resistance state; HR; $R_H$) operation, while the test bench 520 includes a read 0 (low resistance state; LR; $R_L$) operation.

Each of the reading circuit corresponding to the test bench 500 and the reading circuit correspoonding to the test bench, including the various components (e.g. transistors, current source, latch, memory cell) may be as described in the context of the embodiment of the reading circuit 300 of FIG. 3. However, for the test benches 500, 520, a memory array 341 is shown. The memory array 341 may include a plurality of memory cells and a plurality of memory cell access switches, where a respective memory cell, e.g. 342 may be coupled to a respective memory cell access switch, e.g. 315. A respective pair of a memory cell, e.g. 342 and a memory cell access switch, e.g. 315, may be coupled to a respective bit line (BL), e.g. 340, a respective word line (WL), e.g. 348, and a respective source line (SL), e.g. 349.

FIG. 6 shows the timing waveform 602 for the read enable signal, RE, the timing waveform 604 for the precharge signal, and the timing waveform 606 for the enable signal (EN). As shown in FIG. 6, a "high" precharge signal 605 is applied for a first reading time period, $t_1$, after the application of a "high" RE signal 603, while a "high" EN signal 607 is applied for a third reading time period, $t_3$, after the elapse of a time period (second reading time period, $t_2$) after the application of the "high" precharge signal 605.

The simulation results of FIG. 6 also show the reading waveform 620 of the RRAM cell (e.g. 342) for the high resistance (HR; $R_H$) state of the RRAM cell and the reading waveform 622 for the low resistance (LR; $R_L$) state of the RRAM cell (e.g. 342), with the reference voltage, $V_{ref}$, 624 also indicated. The simulation results further show the timing waveform 608 for $D_{out}(R_H)$ or $D_{out}(HR)$ which is the sense amplifier or latch output data or value for $R_H$, as well as the timing waveform 609 for $D_{out}(R_L)$ or $D_{out}(LR)$ which is the sense amplifier or latch output data or value for $R_L$.

It may be observed that the bit line (BL) (e.g. 340) for the $R_H$ state may be always at around the read voltage, $V_{read}$, while the bit line (BL) (e.g. 340) for the $R_L$ state may be discharged to a voltage below $V_{ref}$ 624.

As illustrated by the reading power waveform 630, the reading power is only about 342 pW before the RE enabled signal is applied and only about 4.5 pW after the EN enabled signal is applied. At about the time the precharge signal is applied, there is a spike 632 in the reading power to about 340 µW.

The simulation results show that the reading circuit of various embodiments may be able to address or solve the small reading current problem in RRAM, and the reading circuit may achieve less than approximately 50 ns fast reading speed and accurate results. The reading circuit of various embodiments may be employed for low power applications.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A reading circuit for a resistive memory cell, the reading circuit comprising:
    a current source;
    a precharge switch coupled to the current source;
    a comparator circuit comprising a first input node, a second input node, an output node and an enable node;
    wherein the precharge switch is configured to couple the current source to the first input node of the comparator circuit such that the current provided by the current source is provided to the first input node to apply a precharge voltage at the first input node during a first reading time period, and to decouple the current source from the first input node during a second reading time period;
    wherein the comparator circuit is configured to operate during a third reading time period upon application of an enable signal at the enable node of the comparator circuit;
    at least one memory cell access switch to enable a current flow through a memory cell or to disable a current flow through a memory cell;
    wherein the at least one memory cell access switch is configured to allow a current flow at least partially during the second and the third reading time periods through the memory cell;
    wherein the comparator circuit is further configured to compare a voltage applied to the first input node with a reference voltage applied to the second input node and to determine a programming state of the memory cell based on the voltage present at the first input node during the third reading time period.

2. The reading circuit of claim 1,
wherein the programming state of the memory cell comprises a first programming state and a second programming state.

3. The reading circuit of claim 2,
wherein the voltage at the first input node of the comparator circuit which corresponds to the first programming state of the memory cell is the precharge voltage.

4. The reading circuit of claim 2,
wherein the voltage at the first input node of the comparator circuit which corresponds to the second programming state is obtained by multiplying the current provided by the current source and a resistance of the memory cell at the second programming state.

5. The reading circuit of claim 2,
wherein the voltage at the first input node of the comparator circuit which corresponds to the second programming state is larger than a first value obtained by multiplying the current provided by the current source and a resistance of the memory cell at the second programming state and is smaller than a second value equal to a difference between the reference voltage and a voltage margin.

6. The reading circuit of claim 5,
wherein the reference voltage has a value equal to a difference between the precharge voltage and the voltage margin.

7. The reading circuit of claim 5,
wherein the voltage margin has a range of about 0.01 V to about 0.1 V.

8. The reading circuit of claim 2,
wherein the first programming state of the memory cell is indicative of a high resistance state of the memory cell and the second programming state of the memory cell is indicative of a low resistance state of the memory cell.

9. The reading circuit of claim 2,
wherein the comparator circuit is configured to output at the output node, a first value when the first programming state is determined and a second value when the second programming state is determined.

10. The reading circuit of claim 9,
wherein the first value is 1 and the second value is 0.

11. The reading circuit of claim 1,
further comprising a current mirror comprising a first transistor having a first node, a second node and a gate node and a second transistor having a first node, a second node and a gate node;
wherein the current source comprises an input node and an output node;
wherein the precharge switch comprises a first node, a second node and a gate node;
wherein the input node of the current source is coupled to the second node and the gate node of the first transistor and the gate node of the second transistor, and the output node of the current source is coupled to a first voltage point;
wherein the first node of the first transistor, the first node of the second transistor and the first node of the precharge switch are coupled to a second voltage point.

12. The reading circuit of claim 11,
further comprising a first read enable switch and a second read enable switch respectively comprising a first node, a second node and a gate node; and wherein the memory cell access switch comprises a first node, a second node and a gate node;

wherein the first node of the first read enable switch is coupled to the second node of the second transistor;

wherein the first node of the second read enable switch is coupled to the second node of the memory cell access switch, and the second node of the second read enable switch is coupled to the first voltage point;

wherein the first node of the memory cell access switch is coupled to a first end of the memory cell.

13. The reading circuit of claim 12, further comprising a column selecting switch comprising a first node, a second node and a gate node;

wherein the first node of the column selecting switch is coupled to the second node of the precharge switch.

14. The reading circuit of claim 13, wherein the second node of the first read enable switch and the second node of the column selecting switch are coupled to a second end of the memory cell.

15. The reading circuit of claim 13, wherein the second node of the first read enable switch is coupled to the second node of the precharge switch; and wherein the second node of the column selecting switch is coupled to a second end of the memory cell.

16. The reading circuit of claim 13, further comprising a third transistor comprising a first node, a second node and a gate node;

wherein the first node of the third transistor is coupled to the first input node of the comparator circuit;

wherein the second node of the third transistor is coupled to the second node of the column selecting switch;

wherein the gate node of the third transistor is coupled to the gate node of the column selecting switch.

17. The reading circuit of claim 1, wherein the precharge switch, the memory cell access switch, the first read enable switch, the second read enable switch and the column selecting switch are transistors.

18. The reading circuit of claim 1, wherein the memory cell access switch is a row selecting switch.

* * * * *